Figure 1A:
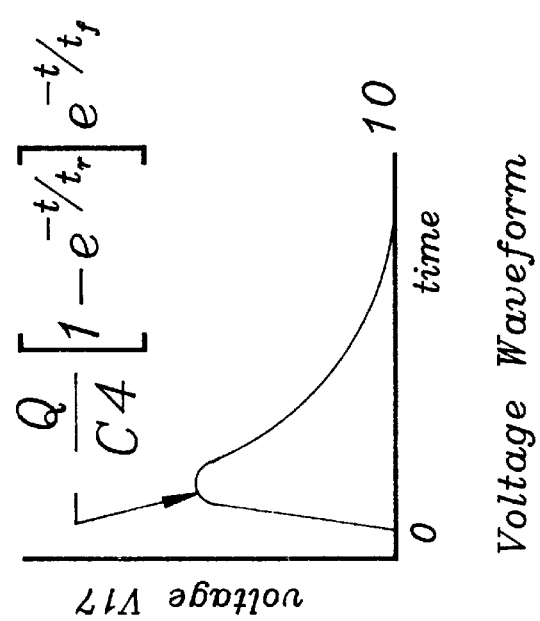

United States Patent
Carroll

Patent Number: 5,990,745
Date of Patent: Nov. 23, 1999

[54] DISCHARGE ELEMENT FOR CHARGE-INTEGRATING PREAMPLIFIER

[76] Inventor: Lewis R. Carroll, 3130 Lewiston Ave., Berkeley, Calif. 94705

[21] Appl. No.: 09/150,519

[22] Filed: Sep. 9, 1998

Related U.S. Application Data
[60] Provisional application No. 60/094,517, Jul. 29, 1998.

[51] Int. Cl.[6] ............... H03F 3/16; H01J 40/14
[52] U.S. Cl. ............ 330/277; 330/308; 250/214 A
[58] Field of Search ...................... 330/277, 300, 330/308, 110; 250/214 A

[56] References Cited

U.S. PATENT DOCUMENTS

| | | | |
|---|---|---|---|
| 3,972,004 | 7/1976 | Libs | 330/308 |
| 4,174,503 | 11/1979 | Merklinger et al. | 330/300 |
| 4,620,321 | 10/1986 | Chown | 250/214 A |
| 4,888,562 | 12/1989 | Edler | 330/308 |
| 5,322,995 | 6/1994 | Ohkawa et al. | 250/214 A |
| 5,347,231 | 9/1994 | Bertuccio et al. | 330/300 |
| 5,801,588 | 9/1998 | Nishiyama | 330/308 |

OTHER PUBLICATIONS

Fazzi, et al Charge–Sensitive Amplifier Front–End with an MJFET and a Forward–Biased Reset Diode IEEE Trans Nucl. Sci. vol. 43, #6 Dec. 1996.

*Primary Examiner*—Robert Pascal
*Assistant Examiner*—Khanh Van Nguyen

[57] ABSTRACT

The input of a source-follower, or equivalent amplifier sub-circuit, utilizing a low-transconductance, low-reverse-leakage, low-capacitance, junction field-effect transistor, with its gate-source junction forward biased, is directly connected to the input of a charge-integrating preamplifier. This provides an attractive alternative to a high-ohm resistor which is typically used as a discharge element in low-noise charge-integrating preamplifiers in nuclear-particle, x-ray, and gamma-ray spectroscopy.

6 Claims, 8 Drawing Sheets

DISCHARGE ELEMENT FOR CHARGE-INTEGRATING PREAMPLIFIER

References: application Ser. No. 08/834,089, filed Apr. 14, 1997; Provisional Patent Application Ser. No. 60/094,517, filed Jul. 29, 1998.

BACKGROUND

1. Field of Invention

This invention relates to apparatus for detecting and amplifying weak impulses of energy absorbed from incident x-ray photons, gamma ray photons, or nuclear charged particles.

2. Discussion of Prior Art

A silicon PIN photodiode or similar photo-active device is often used as a detector for X-ray or gamma-ray photons, electrons (beta particles) or nuclear charged particles. The process of detection may be through direct conversion of collisional energy within the depleted junction region of the diode, or indirectly through intermediate conversion of particle kinetic energy into a flash of light within a scintillating crystal which, in turn, is optically coupled to the photodiode.

In any case, each distinct particle collision imparts a quantity of absorbed energy to the detector producing, in turn, a corresponding quantity of electronic charge. For example: 3.6 electron volts (ev) of absorbed energy are required to produce 1 hole-electron pair in silicon. Thus, a 60 KeV x-ray photon which is completely absorbed produces a pulse containing $(60,000/3.6) \times 1.6 \times 10^{-19} = 2.667 \times 10^{-15}$ coulombs of electronic charge.

Charge-Integrating Preamplifier

Figure 1:
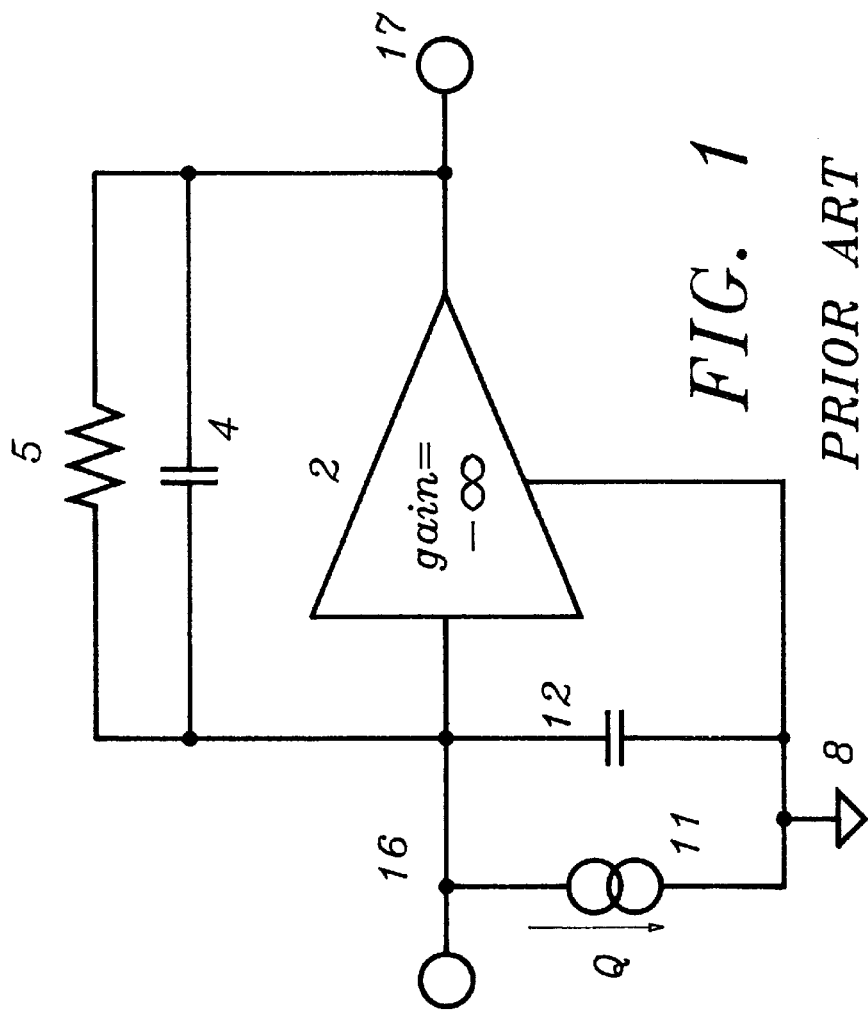

In order to measure such small quantities of charge, each charge-pulse is first converted to a voltage signal by means of a charge-integrating preamplifier. An idealized model of a charge-integrating preamplifier—familiar to those skilled in the art—is shown in FIG. 1:

The photodetector is modelled by the parallel combination of a pulsed current-source 11 in parallel with a capacitor 12—typically the junction capacitance plus stray capacitance of the detector diode and its wiring.

The active gain-element of the preamplifier is represented by an idealized, wideband, infinite-gain, low-noise inverting amplifier 2. This preamplifier configuration exploits the well-known "Miller Effect", wherein the infinite-gain, inverting amplifier causes the charge produced by the detector to be deposited in an integrating capacitor 4 (whose capacitance is designated $C_{int}$) which is deliberately made much smaller than that of detector capacitance 12. For a given amount of detector charge, Q, the voltage signal amplitude at the output of the amplifier is $Q/C_{int}$.

Pulse-Height Spectroscopy

In practice, particle detectors are not used to detect only singular events, but rather a stream of incident particles which, in turn, produces a stream of signal pulses. The amplitude distribution, i.e.—the number of pulses per unit amplitude interval—is termed the "pulse-height spectrum". The intention is to record a pulse-height spectrum which is a true replica of the pulse-amplitude distribution from the detector.

The discharge resistor 5 serves to discharge the integrating capacitor. Without such a discharge element, the voltage on the output of the preamplifier would continue to increase with time due to the sum of leakage currents plus signal currents accumulating as stored charge in the integrating capacitor, causing eventual circuit saturation and amplifier malfunction.

Unfortunately, the discharge resistor may also add substantially to overall system noise. In order to minimize this noise contribution, one must utilize very high values of resistance; 10's, 100's, or even 1000's of megohms are employed for best low-noise performance.

Problems with high-value resistors

However, there are some practical disadvantages to using such high-value resistors. They include:

1. High-value resistors entail long procurement lead times, require "custom" or special-order production and handling, and are relatively high in cost.
2. High-value resistors may still produce "excess noise" above theoretical (thermal noise ) due to "dielectric effects", often requiring selection of individual components for best performance.
3. High-value resistors are not compatible with monolithic integrated circuit fabrication techniques.
4. Active device (FET and PIN diode) leakage currents increase dramatically at elevated temperature. These increased currents, passing through very high value resistors, produce correspondingly large offset voltages, leading to eventual circuit malfunction.

Elimination of the Discharge Resistor

Various methods for performing the discharge function, while eliminating the physical resistor, have been presented in the technical literature. Some solutions entail discharging the integrating capacitor periodically by means of an electronically-actuated switch (Landis, Goulding, et al, "Pulsed Feedback Techniques for Detector Radiation Spectrometers", *IEEE Transactions on Nuclear Science* Vol. NS-18,1972), or a photo-active switch (Goulding, Walton, and Malone, "An Optoelectronic Coupling Feedback Preamplifier for High-Resolution Nuclear Spectroscopy", *Nuclear Instruments and Methods* vol. A322 p. 538, 1992). These solutions, while providing excellent, low-noise performance, are rather complex for the application at hand.

Other solutions for effecting a steady—rather that periodic—discharge function, while eliminating high-ohm resistors and still maintaining very low-noise performance, have been put forward by various workers, including Bertuccio, et al., (U.S. Pat. No. 5,347,231), and Fazzi, et al, ("Charge-Sensitive Amplifier Front-end with NJFET and Forward-Biased Reset Diode" *IEEE Transactions on Nuclear Science*, Vol. 43, No. 6, December 1996).

The former approach utilizes the gate-source junction of a preamplifier's first JFET input stage, operating in a constant forward-biased mode, to effect the discharge function. The latter approach utilizes a forward-biased PN junction diode connected across the input of an amplifier's first JFET.

Both of these utilize a "folded cascode" configuration in order to achieve a high gain-bandwidth product in a relatively simple and compact circuit. As a practical matter—and, as pointed out in the above references—in this type of circuit, where the reset, or discharge function applies only at the amplifier's input terminal, the DC voltage gain is kept low in order to remain reasonably well-centered on a stable, quiescent operating point.

The forward-biased JFET solution of Bertuccio, et al, is effective with small-area diode detectors whose capacitance is on the order of a few picofarads, used in conjunction with small-area JFET devices such as the type NJ26/2N4416 as the first amplifying stage.

However, for larger-area detectors utilizing 1 cm² or larger Si PIN diodes such as the Hamamatsu S3590-08, whose capacitance is on the order of 50 picofarads, or more, a larger-area first JFET is required to obtain optimum, low-noise performance. In general, for lowest noise, the input capacitance of the preamplifier's first JFET should match the junction capacitance of the detector diode. This, in turn, requires the use of large-area JFET devices (such as Interfet, Inc. type IF 4501 or equivalent) of quite high transconductance and—as a consequence—impractically large quiescent drain currents when such JFET's are operated in the forward-gate-bias mode.

Figure 2:
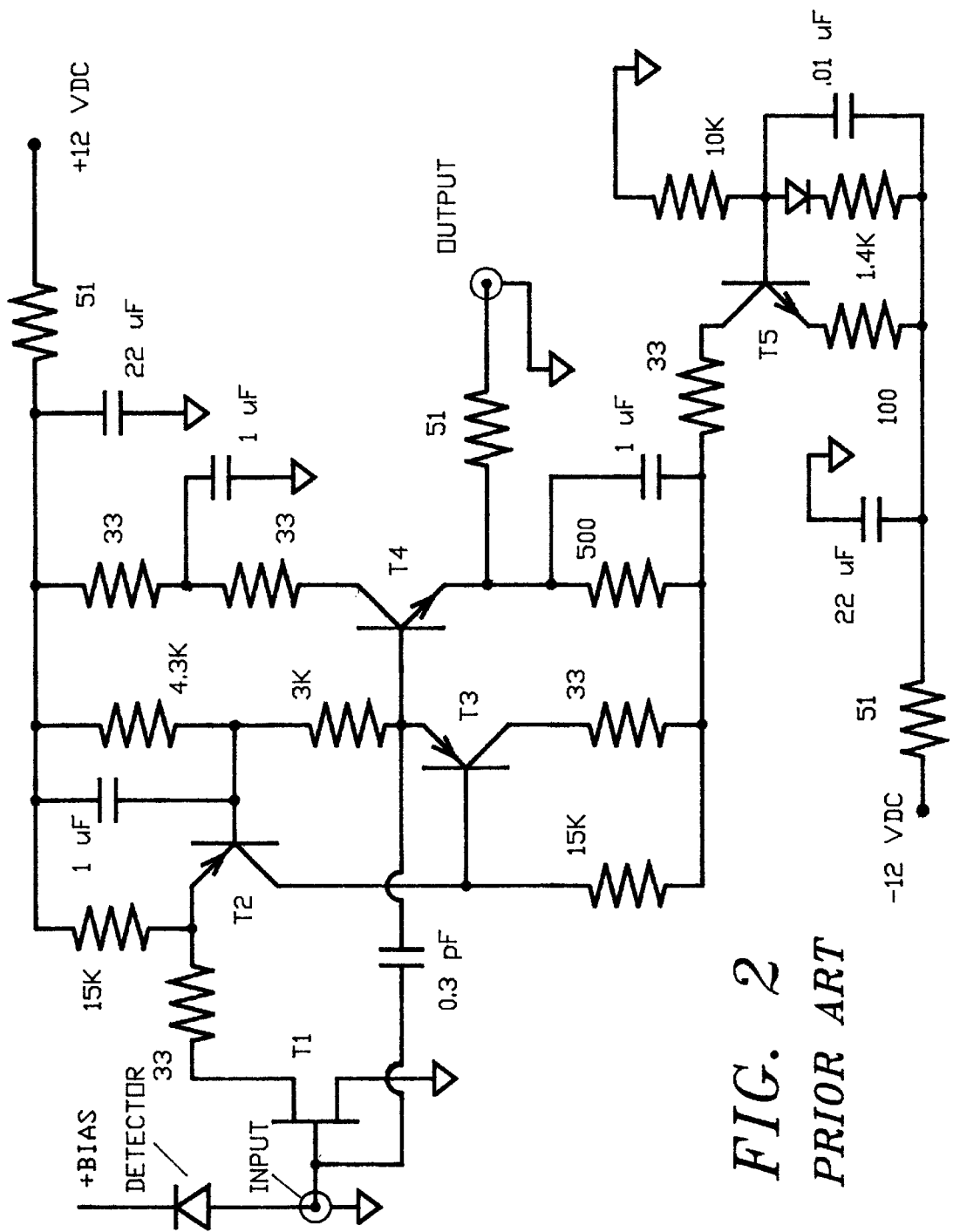

In the circuit presented by Bertuccio, et al, which is reproduced in FIG. 2, the first JFET is operated in the "triode" or unsaturated region at a drain-source voltage of approximately two volts in order to maintain a reasonable drain current with the gate-source junction forward-biased. However, for the larger JFET's being considered in the present work, the zero-bias saturation drain current is so large (~100 milliamperes) and the shunt "on" resistance in the triode operating region so low (a few tens of ohms or less), as to render this approach impractical.

The forward-biased PN junction diode approach of Fazzi, et al, wherein the diode is integrated onto the same monolithic substrate along with the JFET and preamplifier, also utilizes a relatively small-area detector, first JFET, and junction diode. In either case, these solutions are not readily adaptable to a new type of non-inverting charge-integrating preamplifier currently under development.

A Non-Inverting Charge-Integrating Preamplifier

The search for an alternative concept is motivated by the need to develop a discharge method which is compatible with our implementation of a new type of non-inverting charge-integrating preamplifier which, in turn, is the subject of a currently-pending patent application Ser. No. 08/834,089, filed Apr. 14, 1997. The original, idealized concept presented in the aforementioned application is reproduced in FIG. 3:

The detector is once again modelled as a pulsed current source 11b in parallel with a capacitor 12b, but instead of being connected to the inverting input of a high-gain amplifier, the detector is now connected between the output and the input of a unity-gain, non-inverting amplifier 3b. The discharge resistor 5b and integrating capacitor 4b are connected between the input of the amplifier and ground, or circuit common 8.

For an equivalent set of values for the various parameters and components—the charge Q, detector capacitance $C_d$, integrating capacitance $C_{int}$, discharge resistance $R_d$, etc. the performance of this implementation is exactly equivalent to that of FIG. 1, as suggested by the identical voltage waveforms.

Practical Embodiment of Non-Inverting Preamplifier

A practical embodiment of the, non-inverting charge-integrating preamplifier presented in App'n Ser. No. 08/834,089, filed Apr. 14, 1997, is reproduced in FIG. 4.

As a practical matter, the circuitry comprising the detector and preamplifier assembly is housed in an opaque, metallic enclosure 30 to provide shielding against unwanted ambient light and stray electromagnetic fields. A thin metallic membrane 34 keeps out unwanted light and electromagnetic fields, but allows X-ray photons, gamma-ray photons, or charged particles to impinge on the detector.

Cascode JFET's 61 and 62 comprise the input stage of a unity-gain, non-inverting preamplifier. Diode 59 is back-biased. In this embodiment, the anode of 59 is connected to the gate of JFET 61. Resistor 29 is connected between the cathode of 59 and the detector power supply bus 27. In addition to the bias connection, 29 also provides signal isolation, or decoupling. Resistor 29 has a resistance of 1 megohm or more. The cathode of 59 is also AC coupled to the source (output) terminal of JFET 61 through capacitor 67. For best gain and low-noise performance coupling capacitor 67 must have high capacitance to insure efficient signal-coupling: In this embodiment the capacitance of 67 should be a factor of 100 or more greater than the junction capacitance of 59.

JFET 60 plus resistor 64 function as a high-impedance (current source) load for JFET's 61–62. Capacitor 68, comprising the input capacitance of the amplifier, plus stray wiring capacitance, functions as the integrating capacitor, $C_{int}$. The charge-signal, Q''', produces a voltage pulse whose amplitude is ($Q'''/C_{int}$). This voltage pulse is applied to the gate of JFET 63, whose source is bypassed to ground by capacitor 66. JFET 63 consequently functions as a high-gain transconductance (voltage-to-current) amplifying stage. The resulting pulsed-current signal $I_{sig}$ from the drain terminal of 63 is then transmitted to a remote "signal-receiver" and post amplifier by means of a coaxial cable of arbitrary length.

Figure 4:
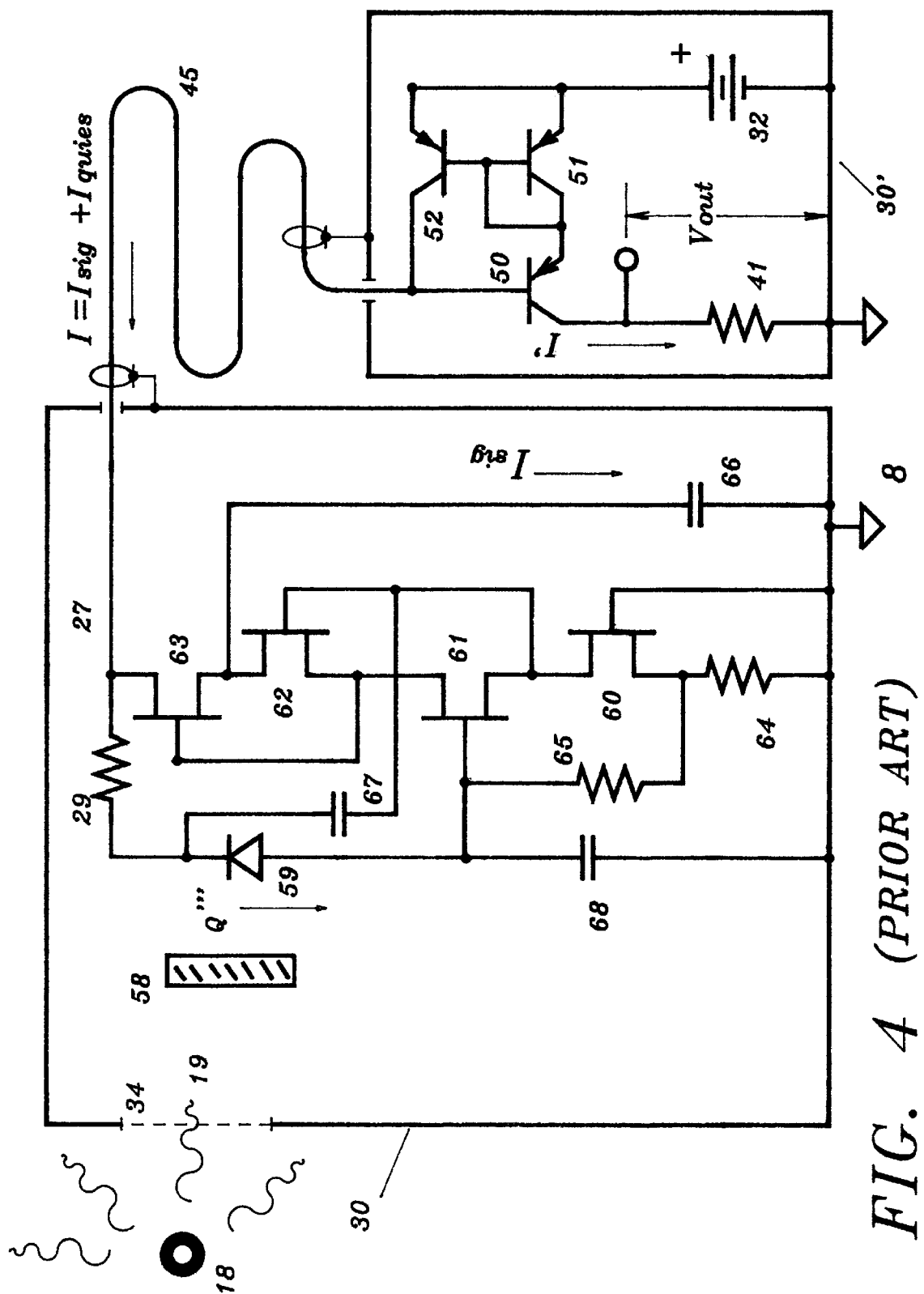

The preamplifier circuit in FIG. 4 utilizes a high-ohm discharge resistor 65. The signal current and leakage current produced in diode 59, plus reverse-gate-leakage current from 61 are all discharged to "ground", or signal common, through resistors 65 and 64.

This circuit has been employed successfully in variety of radiation detector applications. However, its performance can be substantially improved by eliminating the high-ohm discharge resistor.

Objects and Advantages of the Invention

Therefore it is an object of the present invention to implement a steady reset or discharge function in a charge-integrating preamplifier, equivalent to that provided by a high-ohm resistor, but without requiring a physical high-ohm resistor.

A further object of the invention is to achieve low-noise performance in a charge-integrating preamplifier that is substantially equivalent to the low-noise performance employing a high-ohm discharge resistor, but without requiring a physical high-ohm resistor.

Another object of the invention is to implement a discharge element for a charge-integrating preamplifier used in conjunction with relatively large-area (and, in consequence, large-capacitance) diode detectors, and correspondingly large-area first-JFET preamplifier stages.

Another object of the invention is to implement a discharge element which is compatible with a new, non-inverting type of charge-integrating preamplifier which, in turn, is the subject of a currently-pending patent application.

Another object of the invention is to implement a discharge element for a charge-integrating preamplifier which can help mitigate the degradation in circuit performance which occurs at higher ambient temperatures, due to increased detector-diode and preamplifier-input JFET reverse-leakage currents.

Another object of the invention is to implement a discharge element for a charge-integrating preamplifier which is compatible with both discrete-component and monolithic integrated-circuit fabrication techniques.

Other features, advantages, and novel aspects of the invention will become apparent to those skilled in the art from the following specifications and drawings illustrating the underlying concept and examples of practical embodiments.

DRAWING FIGURES

FIG. 1—An idealized model of a charge-integrating preamplifier of the prior art.

FIG. 2—A contemporary solution for elimination of the physical, high-ohm discharge resistor in a low-noise, charge-integrating preamplifier.

Figure 3A:
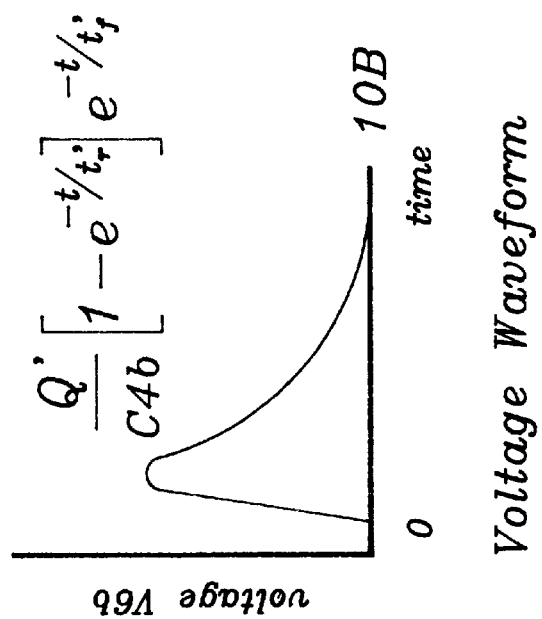
Figure 3:
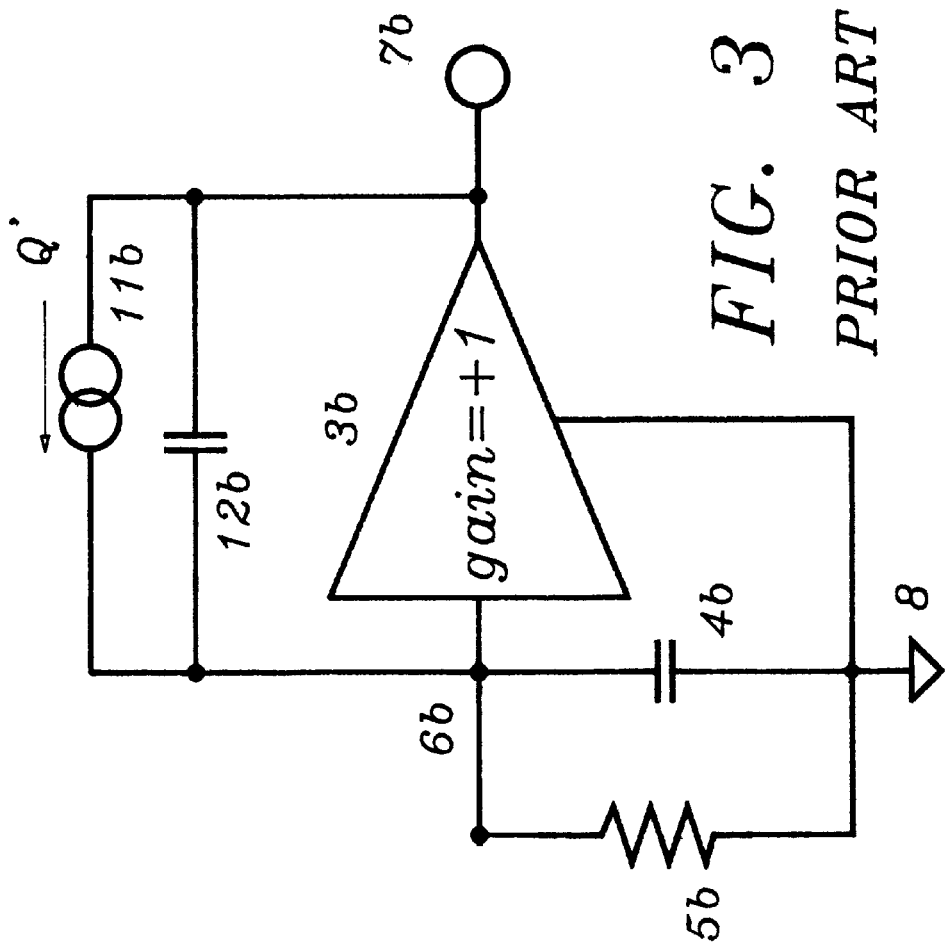

FIG. 3—An idealized model of a non-inverting charge-integrating preamplifier.

FIG. 4—A practical embodiment of a non-inverting charge-integrating preamplifier employing a high-ohm resistor as a discharge-element.

Figure 5:
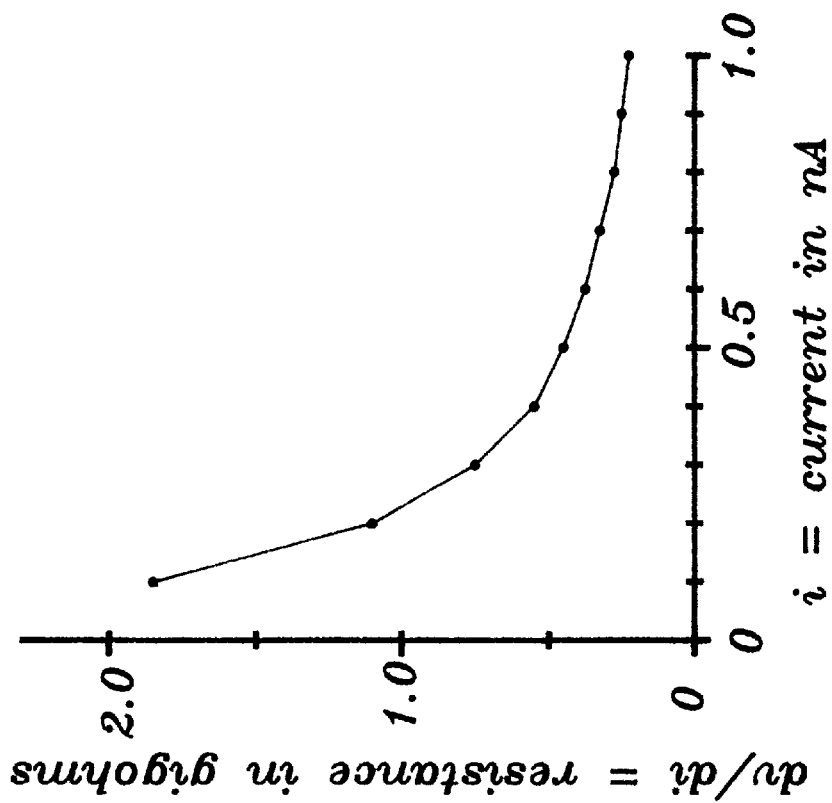
Figure 5:
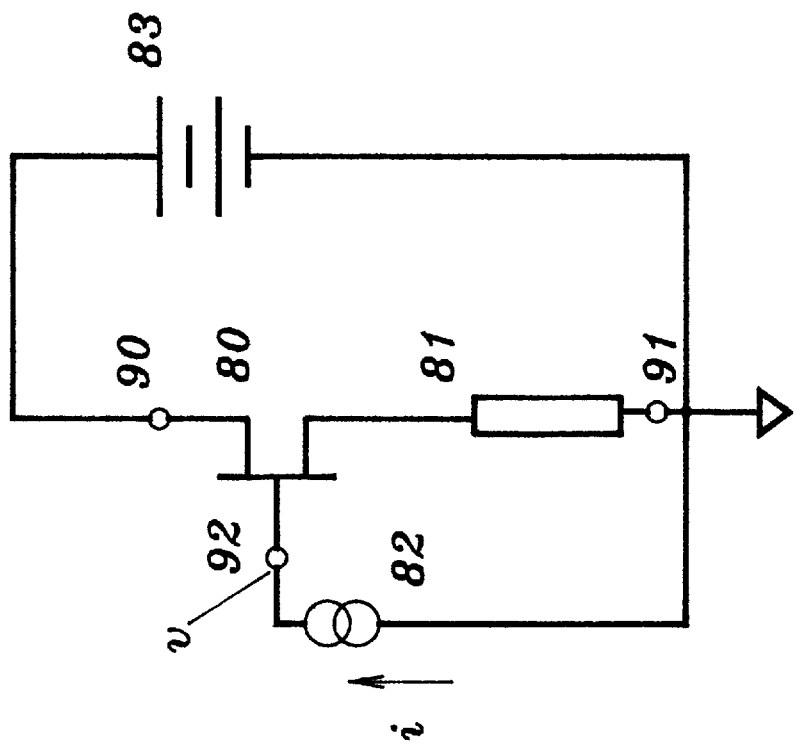

FIG. 5—The Invention: A method for eliminating the high-ohm discharge resistor, which is compatible with the non-inverting-type charge-integrating preamplifier of FIG. 4.

Figure 5A:
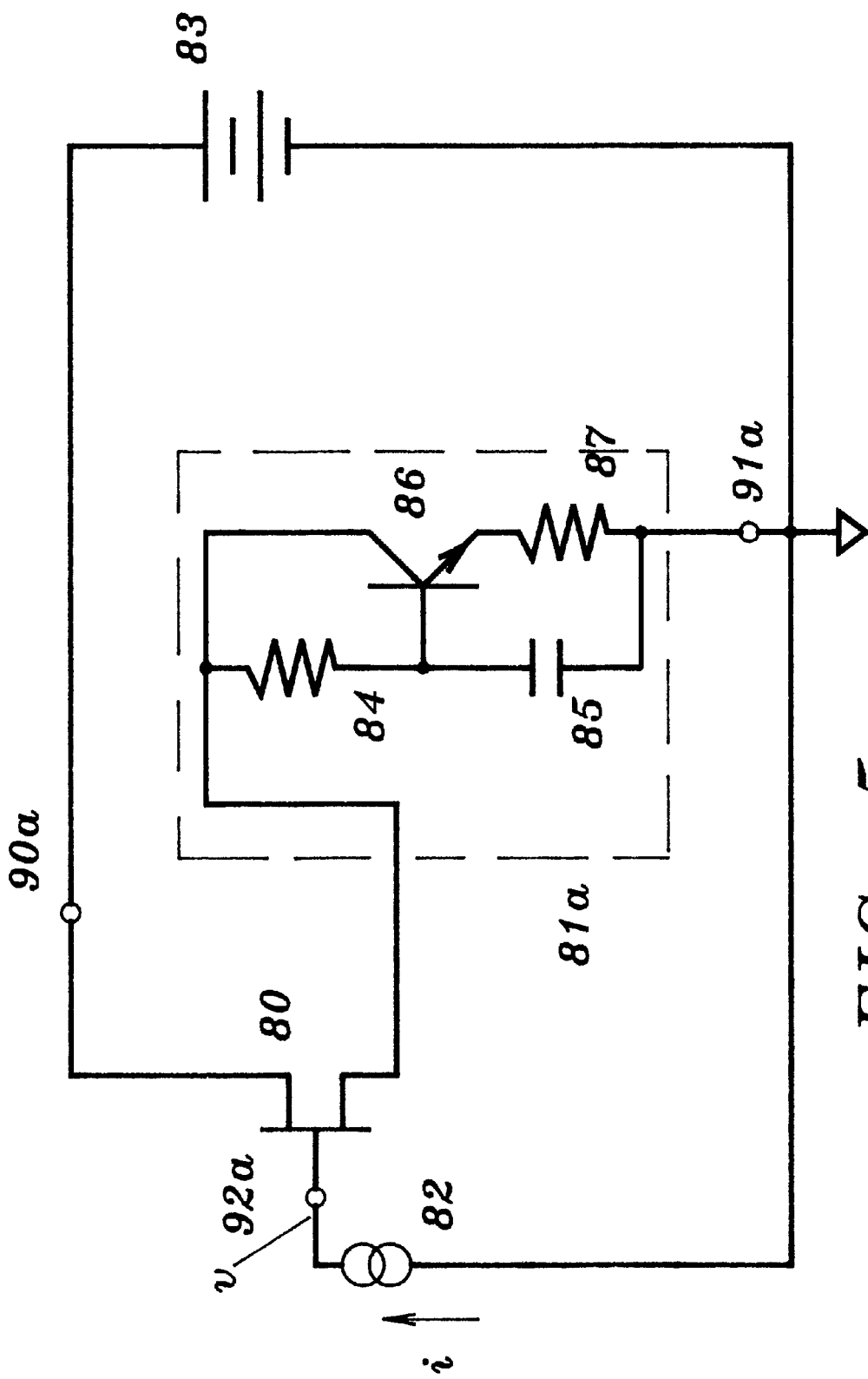

FIG. 5a—An embodiment of the circuit of the invention.

Figure 6:
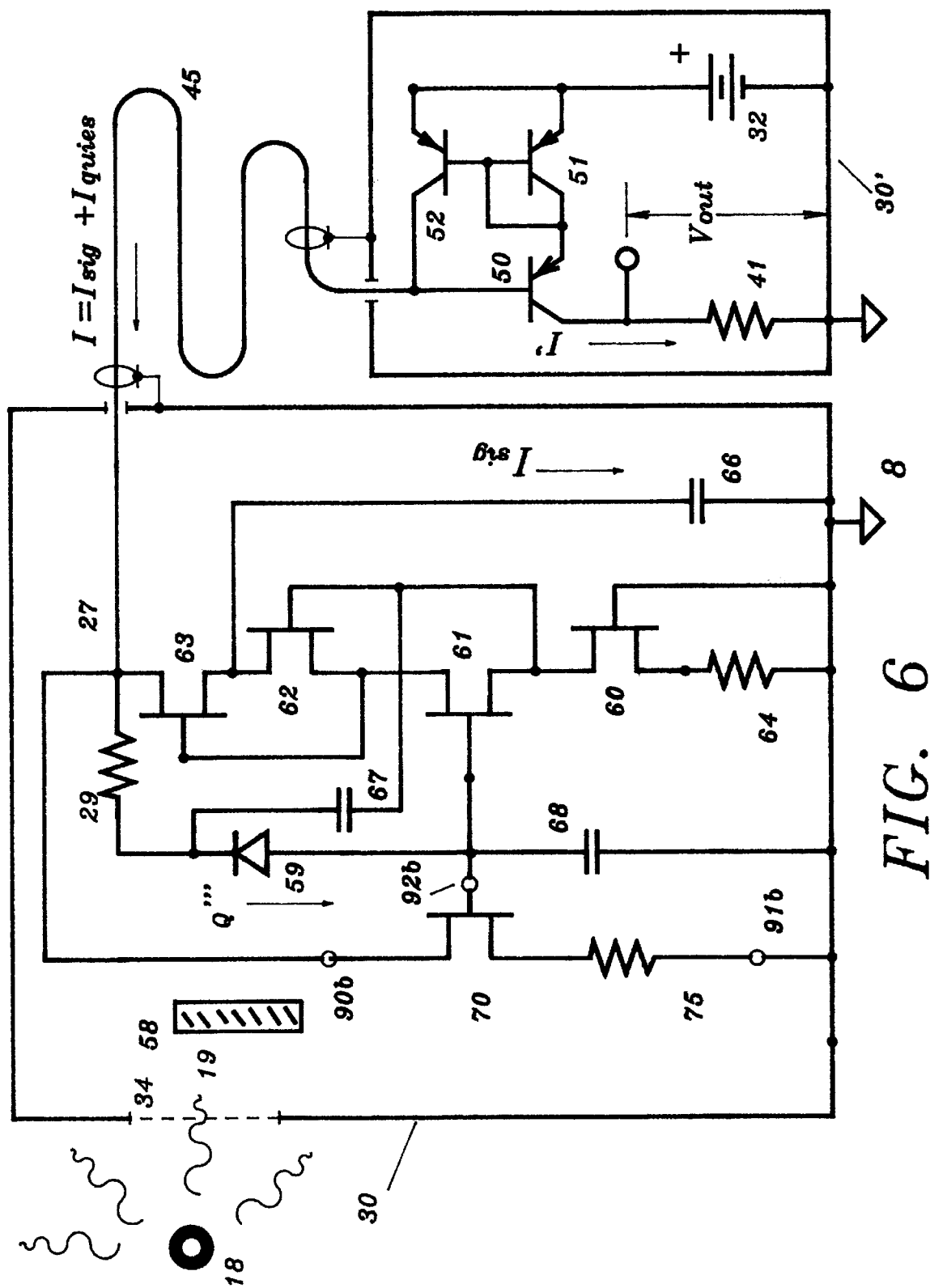

FIG. 6—A practical embodiment: A non-inverting-type charge-integrating preamplifier incorporating the invention.

Figure 7:
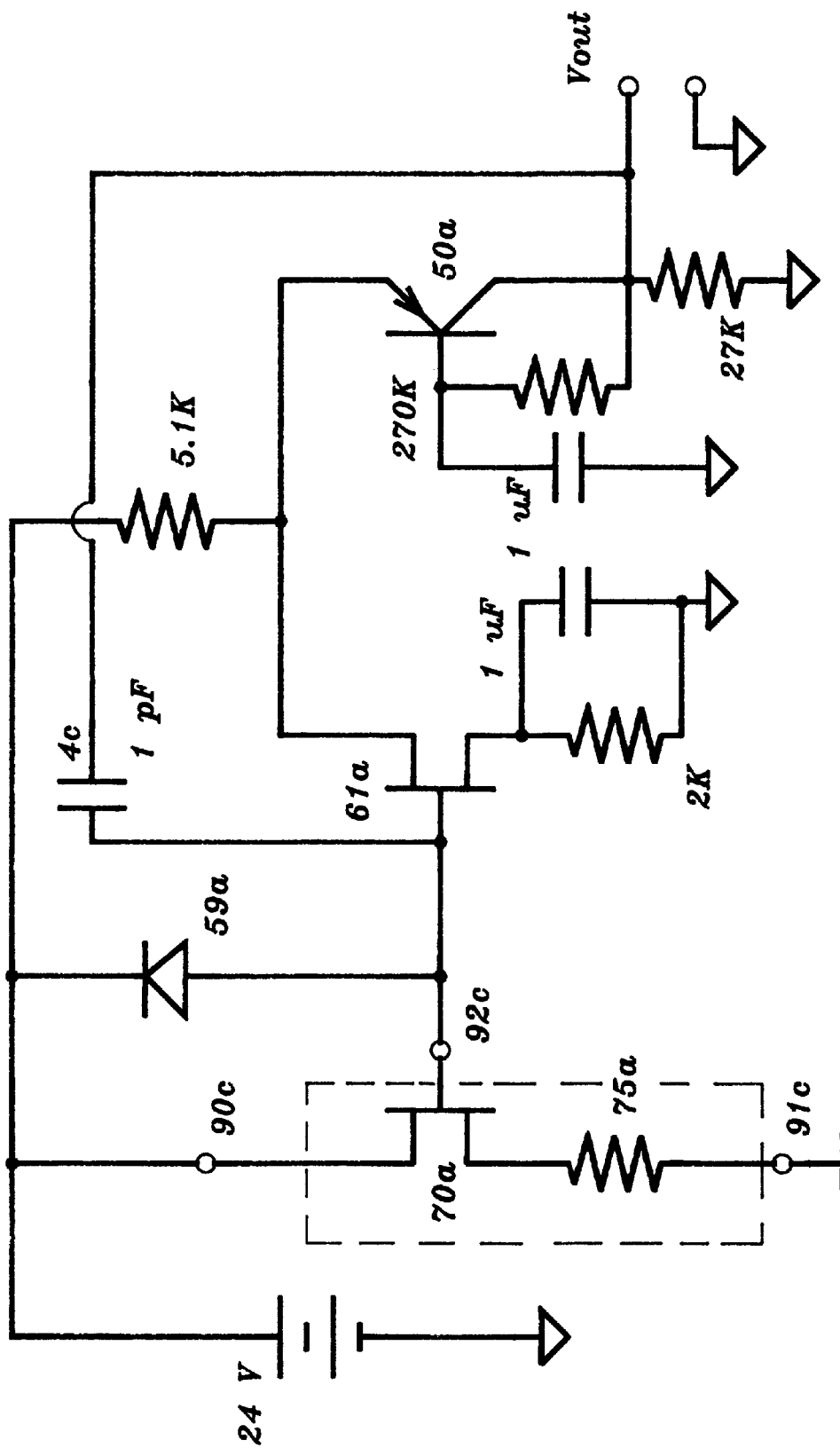

FIG. 7—A practical embodiment: An inverting-type charge-integrating preamplifier incorporating the invention.

REFERENCE NUMERALS IN DRAWINGS

2 Idealized, high-gain, inverting, amplifier model
3b Idealized unity-gain, non-inverting, amplifier model
4, 4b, 4c Capacitors with capacitance C4, C4b, C4c respectively
5, 5b Resistors with resistance R5, R5b respectively
6b Input terminal ; the voltage at terminal 6b is designated V6b
7b Output terminal; voltage at terminal 7b is designated V7b
8 Signal "common" or "ground" reference
10 Voltage waveform of idealized prior-art preamplifier configuration
10b Voltage waveform of idealized, non-inverting configuration
11, 11b Pulsed current-source
12, 12b Capacitor representing detector capacitance
16 Input terminal; the voltage at this terminal is designated V16
17 Output terminal; the voltage at this terminal is designated V17
18 Photon Source
19 X-ray or gamma ray photons
27 Detector probe power-supply bus
29 Transducer bias and signal isolation resistor
30 Metallic shielding enclosure housing detector probe assembly
30' Metallic shielding enclosure housing signal-receiving circuit assembly
32 (+)Voltage power supply
34 Thin, metallic membrane
41 Load resistor
45 Coaxial cable of arbitrary length
50, 50a, 51, 52 PNP bipolar transistors
58 Scintillating crystal
59, 59a Silicon PIN diode serving as a photon detector
60, 61, 61a, 62, 63 Junction field-effect transistors (JFET's)
64 JFET source-bias resistor
65 High-ohm Resistor
66 Bypass capacitor
67 Coupling capacitor
68 Integrating capacitor comprising input capacitance of amplifier, wiring capacitance, etc.
70,70a, 80 Junction FET—low Gm-type
75, 75a Source-bias resistor
81, 81a, Source-bias resistor/source-follower load circuit
82 Current supply
83 Voltage supply
84 Base-bias resistor
85 Bypass capacitor
86 NPN transistor
87 Emitter resistor 90, 90a, 90b, 90c Discharge element power supply terminal
91, 91a, 91b, 91c Discharge element ground terminal
92, 92a, 92b, 92c Discharge element input terminal

DESCRIPTION OF THE INVENTION

The basic elements of the present invention are shown in FIG. 5. The discharge element is represented as a sub-circuit which is intended to be incorporated into a charge-integrating preamplifier. To emphasize this point, terminal connections are shown for power supply 90, input 92, and ground 91. The aggregate of detector diode signal current, leakage current, and preamplifier reverse-gate leakage current are represented by a current i. This current is applied to the input terminal of the sub-circuit which, in turn, contains a source-follower-type amplifier employing a junction field-effect transistor (JFET) 80 operating with its input gate-source junction forward-biased.

Other semiconductor devices, such as bipolar transistors connected in a "Darlington" configuration may, in principle, be used for the input stage of the sub-circuit. However, junction FET's are preferred for their superior high-impedance and low-noise performance characteristics. Element 81 provides source-bias and acts as a load for 80.

FIG. 5a shows one possible implementation; the load circuit, designated here as 81a, (circuit shown blocked-in by a dotted line) for source-follower stage 80 comprises NPN bipolar transistor 86 (2N3904 or equiv.), emitter resistor 87 (4.7K ohm), bypass capacitor 85 (1 uF), and base-bias resistor 84 (1 megohm). Circuit 81a provides a relatively low-resistance sink for the DC quiescent source current from 80, while presenting a high AC resistance (~1 megohm) for the higher-frequency, signal-related component of source current from 80. As a consequence, the gate input terminal 92a of JFET 80 offers a correspondingly low-impedance sink for the DC component of leakage current i, while maintaining the required high impedance for the AC signal component.

This particular implementation—and other variations on the basic concept which will be obvious to those skilled in the art—may be useful in situations where the input to the discharge-element must sink relatively high DC leakage currents—for example, i ranging well in excess of 1 nA—while maintaining the highest possible AC impedance at its input-terminal. This becomes important when the preamplifier is operated at elevated ambient temperatures, where leakage currents can increase substantially. Computer simulation shows approximately $2.5 \times 10^{10}$ ohms AC input resistance (at midband) for 100 pA DC input current, with the AC input resistance dropping by approximately an order of magnitude for every ten-fold increase in DC input "leakage" current, up to ~100 nA.

On the other hand, in the simplest, most straightforward, yet fully practical embodiment, element 81 is merely a resistor of predetermined value.

JFET 80 is chosen to have low input capacitance relative to the input capacitance of the companion preamplifier's input JFET so as to maintain the lowest possible shunt capacitance across the input of the active preamplifier stage. As a practical matter—particularly for portable, battery-powered applications—JFET 80 should also have low transconductance relative to that of the input stage of the preamplifier (preferably no more than a few 100's of micro-siemens) so that, when its gate junction is forward biased, its drain current will not exceed a few 100's of microamperes. 80 must also have a very low reverse gate leakage current relative to that of the preamplifier input stage—preferably no more than a few picoamperes—in order to maintain the highest possible gate-terminal resistance. An example of a suitable JFET device for this application is the 2N4117, 2N4117A, or various commercial equivalents manufactured by Siliconix, Inc., Interfet, Inc., and others.

In principle, moreover, since the device's technical parameters—interelectrode capacitance, transconductance, etc.—are all related to device geometry and device fabrication process parameters, a functional equivalent to the above-named discrete component may be incorporated into a monolithic integrated circuit by techniques which are known to those skilled in the art.

Input Resistance

The results of a computer simulation of the circuit are also shown in FIG. 5. The simulation was conducted utilizing a commercial version of the "Spice 3" electronic circuit simulation program developed at the University of California at Berkeley, in conjunction with JFET device model parameters derived from device terminal measurements and data sheet values for the type 2N4117 JFET. For this simulation, element 81 was chosen to be a source-bias resistor of 39K ohms. For a power supply voltage of 24 VDC a gate-input resistance in excess of 1 gigohm ($10^9$ ohms) is realized for gate-input currents of 200 pA or less in forward-bias operation, dropping to ~0.25 gigohm at 1 nA input.

FIG. 6 is a schematic diagram of a preferred embodiment of the non-inverting preamplifier circuit, nearly identical to that in FIG. 4, but now shown incorporating the invention. Instead of utilizing a high-ohm discharge resistor 65 as shown in FIG. 4, the leakage current from the diode detector 59, plus the reverse gate leakage current from 61, the preamplifier's first-JFET, is now applied to the gate of 70, a low-transconductance, N-channel junction FET.

In this embodiment, the drain of 70 is connected to power supply bus 27. Resistor 75 (39K ohms) acts as the source-load for 70, and is connected to circuit common.

Further analysis by computer simulation over a wide range of frequencies shows that the signal to noise ratio—particularly at lower frequencies, which are important in the case of long (4–5 microseconds or more) shaping times used with Cesium Iodide and similar scintillating crystals—is equal or superior to that obtained with a 1 gigohm resistor. This has been further verified in actual physical experiments employing the circuit of FIG. 6.

Inverting-type Charge-integrating Preamplifier The circuit of FIG. 5 may also be utilized as a discharge element in an inverting-type charge-integrating preamplifier circuit, as shown in FIG. 7. The input stage comprising JFET device 61a, together with PNP bipolar transistor 50a, function as a high-gain, inverting amplifier. A 1 pF feedback integrating capacitor 4c is shown connected from the output to the input of the preamplifier. The input signal is generated in detector diode 59a, and the output signal is measured at the terminal labelled Vout. The circuit differs from that of FIG. 2 in that the input stage 61a is no longer limited to small, low-capacitance JFETs, nor is the input stage constrained to operate in "triode" mode. The quiescent operating current for 61a is governed by its source-bias resistor: Computer simulation shows that the component values in FIG. 7 provide a satisfactory DC operating point for a variety of preamplifier JFET types.

The gate of the discharge JFET 70a is connected to the gate of the preamplifier input JFET 61a. Leakage current from detector diode 59a, as well as reverse gate leakage current from 61a is returned to circuit common through the forward-biased gate-source junction of JFET 70a and its source-bias resistor, 75a, maintaining high input impedance at the input to the amplifier without the need for high-ohm resistors.

Summary, Ramifications, and Scope of the Invention

A new discharge-circuit concept is illustrated which eliminates high-ohm resistors typically used as discharge elements in low-noise, charge-integrating preamplifiers such as used with reverse-biased semiconductor diodes in photon and charged-particle radiation detectors.

The discharge-circuit utilizes the input-gate of a low-capacitance, low-transconductance, low reverse-gate-leakage junction field-effect transistor (JFET), with its gate-source junction forward-biased, in a source-follower type amplifier. The input gate-terminal of the discharge-JFET is directly connected to the gate-terminal of the preamplifier input-JFET stage.

In addition to addressing problems relating to dielectric effects ("excess noise"), high cost, difficult parts-procurement, etc., the elimination of high-ohm resistors allows substantially all of the preamplifier to be implemented either with discrete-components or as a monolithic integrated circuit.

The discharge element subcircuit concept can be adapted to various charge-integrating preamplifier circuits, including a newly-developed preamplifier based on a non-inverting, unity-gain input stage. Preamplifiers utilizing such discharge-element subcircuits are well-suited for use with relatively large-area, high-transconductance, high-capacitance preamplifier input junction field-effect transistors, such as are necessary for optimum, low-noise performance with large (~1 $cm^2$ and larger) Si PIN detector diodes.

For total detector leakage currents of a few hundred picoamperes or less, the forward-biased gate-source junction in a simple JFET source-follower sub-circuit with a resistor as source-load, can be used to steadily discharge the preamplifier's integrating capacitor, producing the same—or better—low-noise performance as a one gigohm resistor, but without requiring a physical resistor of such value.

A more elaborate implementation of the discharge-element subcircuit can maintain an AC impedance of hundreds of megohms—and consequent low-noise preamplifier performance for leakage currents Up to some tens of nanoamperes, as might be encountered when operating the detector at elevated temperatures.

While the above description contains many specifications, these should not be construed as limitations on the scope of the invention, but rather as examples of preferred embodiments. Other variations are possible, and may be utilized according to the particular application. Accordingly, the scope of the invention should be determined not by the embodiments illustrated, but by the appended claims and their legal equivalents.

I claim:

1. A charge-integrating preamplifier,
    said preamplifier containing a first junction field-effect transistor (JFET) at the input of a non-inverting first voltage-amplifying circuit, said first voltage-amplifying circuit having a signal input, a signal output, and a signal common, or ground-reference point,
    the gate terminal of said JFET being the signal input of said first voltage-amplifying circuit, wherein the voltage gain from the gate terminal of said JFET to the signal output of the first voltage-amplifying circuit, referred to signal common, is essentially unity,
    said preamplifier receiving signal current-pulses from a reverse-biased semiconductor diode, of which one terminal is connected to the input gate terminal of said first JFET, the second terminal of said reverse-biased semiconductor diode being AC-coupled to the non-inverting, unity-gain signal output of said first voltage-amplifying circuit, the second terminal of said reverse-biased semiconductor diode also being connected through a signal-isolation means to a bias potential, said preamplifier containing an integrating capacitor, of which one terminal is connected to the input gate terminal of said first JFET, and the second terminal is connected to circuit common, said reverse-biased semiconductor diode producing a finite DC reverse-leakage current in addition to said signal current-pulses, said first JFET producing a finite DC reverse-gate leakage current, the aggregate of said diode reverse leakage current, plus said JFET reverse-gate leakage current, plus said signal current-pulses accumulating as stored charge in said integrating capacitor, said preamplifier incorporating a sub-circuit to steadily discharge said integrating capacitor, said sub-circuit having an input terminal connection, plus terminal connections for power supply and circuit common, said sub-circuit having a second JFET as its input stage, the gate terminal of said second JFET being the input to a source-follower-type amplifier, said second JFET having low input-capacitance, low transconductance, and low reverse-gate-leakage current relative to the corresponding parameters of said first preamplifier JFET, the gate terminal of said second JFET being the input terminal connection of said sub-circuit, said second JFET gate terminal being directly connected to said preamplifier first JFET input gate terminal, said second JFET gate-source junction being forward-biased by the aggregate of said DC leakage plus signal currents, said second JFET gate terminal providing, thereby, a high-resistance conducting means to steadily discharge said integrating capacitor.

2. The charge-integrating preamplifier of claim 1, implemented in the form of a monolithic integrated circuit.

3. A charge-integrating preamplifier, said preamplifier incorporating a high-gain, inverting amplifier with a signal input, a signal output, power supply, and common, or ground connections, said preamplifier containing a first junction field effect transistor (JFET) input stage, said preamplifier receiving signal current-pulses from a reverse-biased semiconductor diode, of which one terminal is connected to the input gate terminal of said first JFET input stage, the second terminal of said diode being connected to a bias potential, said preamplifier containing an integrating capacitor, of which one terminal is connected to the input gate terminal of said first JFET input amplifying stage, the second terminal of said integrating capacitor being connected to the signal output of said inverting amplifier, said reverse-biased semiconductor diode producing a finite DC reverse-leakage current in addition to said signal current-pulses, said first JFET input amplifying stage producing a finite DC reverse-gate leakage current, the aggregate of said diode reverse leakage current, plus said JFET reverse-gate leakage current, plus said signal current-pulses accumulating as stored charge in said integrating capacitor, said preamplifier incorporating a sub-circuit to steadily discharge said integrating capacitor, said sub-circuit having an input terminal connection, plus terminal connections for power supply and circuit common, said sub-circuit having a second JFET at its input, the gate terminal of said second JFET being the input to a source-follower-type amplifier, said second JFET having low input-capacitance, low transconductance, and low reverse-gate-leakage current relative to the corresponding parameters of said first preamplifier JFET, the gate terminal of said second JFET being the input terminal connection of said sub-circuit, said second JFET gate terminal being directly connected to said preamplifier first JFET input gate terminal, said second JFET gate-source junction being forward-biased by the aggregate of said DC leakage plus signal currents, said second JFET gate terminal providing, thereby, a high-resistance conducting means to steadily discharge said integrating capacitor.

4. The charge-integrating preamplifier of claim 3, implemented in the form of a monolithic integrated circuit.

5. A charge-integrating preamplifier, said preamplifier incorporating a high-gain, inverting amplifier with a signal input, a signal output, power supply, and common, or ground connections, said preamplifier containing a first amplifying device, said preamplifier receiving signal current-pulses from a reverse-biased semiconductor diode, of which one terminal is connected to the input terminal of said first amplifying device, the second terminal of said diode being connected to a bias potential, said preamplifier containing an integrating capacitor, of which one terminal is connected to the input terminal of said first amplifying device, the second terminal of said integrating capacitor being connected to the signal output of said inverting amplifier, said reverse-biased semiconductor diode producing a finite DC reverse-leakage current in addition to said signal current-pulses, the aggregate of said leakage current, plus said signal current-pulses accumulating as stored charge in said integrating capacitor, said preamplifier incorporating a sub-circuit to steadily discharge said integrating capacitor, said sub-circuit having an input terminal connection, plus terminal connections for power supply and circuit common, said sub-circuit having a junction field-effect transistor (JFET) at its input, the gate terminal of said JFET being the input to a source-follower-type amplifier, said second JFET having low input-capacitance, low transconductance, and low reverse-gate-leakage current relative to the corresponding parameters of said preamplifier first amplifying device, the gate terminal of said JFET being the input terminal connection of said sub-circuit, said JFET gate terminal being directly connected to said preamplifier first amplifying device input terminal, said JFET gate-source junction being forward-biased by the aggregate of said DC leakage plus signal currents, said JFET gate terminal providing, thereby, a high-resistance conducting means to steadily discharge said integrating capacitor.

6. The charge-integrating preamplifier of claim 5, implemented in the form of a monolithic integrated circuit.

* * * * *